United States Patent
Fujiwara et al.

(10) Patent No.: US 6,887,646 B1
(45) Date of Patent: May 3, 2005

(54) CHEMICAL AMPLIFICATION RESIST COMPOSITION

(75) Inventors: Tadayuki Fujiwara, Hiroshima (JP); Yukiya Wakisaka, Hiroshima (JP); Masayuki Tooyama, Kanagawa (JP)

(73) Assignee: Mitsubishi Rayon Co., Ltd., Tokyo (JP)

( * ) Notice: Subject to any disclaimer, the term of this patent is extended or adjusted under 35 U.S.C. 154(b) by 236 days.

(21) Appl. No.: 10/030,430

(22) PCT Filed: Jul. 11, 2000

(86) PCT No.: PCT/JP00/04623

§ 371 (c)(1),
(2), (4) Date: Jan. 10, 2002

(87) PCT Pub. No.: WO01/04706

PCT Pub. Date: Jan. 18, 2001

(30) Foreign Application Priority Data

| Jul. 12, 1999 | (JP) | ............... 11-198160 |
| Jul. 13, 1999 | (JP) | ............... 11-199098 |
| Jul. 13, 1999 | (JP) | ............... 11-199099 |
| Aug. 16, 1999 | (JP) | ............... 11-230059 |

(51) Int. Cl.$^7$ ............... G03F 7/004
(52) U.S. Cl. ............... 430/270.1; 430/905; 430/910
(58) Field of Search ............... 430/270, 905, 430/910, 270.1, 326

(56) References Cited

U.S. PATENT DOCUMENTS

| 5,498,506 A | 3/1996 | Wengenroth et al. |
| 5,624,787 A | 4/1997 | Watanabe et al. |
| 5,770,343 A | * 6/1998 | Sato et al. ............... 430/170 |
| 5,876,900 A | 3/1999 | Watanabe et al. |
| 5,968,713 A | 10/1999 | Nozaki et al. |

FOREIGN PATENT DOCUMENTS

| EP | 0 537 524 | 4/1993 |
| EP | 0 749 044 | 12/1996 |
| EP | 0 856 773 | 8/1998 |
| JP | 6-266110 | 9/1994 |
| JP | 7-92681 | 4/1995 |
| JP | 10-207069 | 8/1998 |

OTHER PUBLICATIONS

Derwent Abstracts AN 88–215340, XP–002031001, JP 63–149640, Jun. 22, 1988.

* cited by examiner

*Primary Examiner*—Rosemary Ashton
(74) *Attorney, Agent, or Firm*—Oblon, Spivak, McClelland, Maier & Neustadt, P.C.

(57) ABSTRACT

The present invention discloses a chemically amplified resist composition comprising: a resin which becomes soluble in an aqueous alkali solution in the presence of an acid, a photo acid generator, and an amine derivative which shows, in water of 25° C., such a basicity as to form a conjugate acid and has a medium polarity. The amine derivative acts as a quencher. Therefore, the chemically amplified resist composition of the present invention enables formation of a very precise and fine resist pattern and can be suitably used particularly in a lithography using an ArF excimer laser beam.

13 Claims, No Drawings

CHEMICAL AMPLIFICATION RESIST COMPOSITION

TECHNICAL FIELD

The present invention relates to a chemically amplified resist composition, particularly a chemically amplified resist composition suitably used in microfabrication using an excimer laser beam or an electron beam.

BACKGROUND ART

In recent years, in the microfabrication employed in production of a semiconductor device or a liquid crystal device, a progress has been seen in lithography technology; as a result, a rapid progress is taking place in fine pattern formation. As the means for fine pattern formation, a light of shorter wavelength is generally used for exposure; specifically, a conventional ultraviolet light represented by g-line or i-line is being changed to a DUV.

Currently, a lithography technology using a KrF excimer laser beam (248 nm) has been introduced into the market; a lithography technology using an ArF excimer laser bea m (193 nm) of even shorter wavelength is being introduced; and a lithography technology using a $F_2$ excimer laser beam (157 nm) is under study as a next generation technology. Further, vigorous studies are under way on lithography technologies using an electron beam, an EUV, an X ray, an ion beam, etc., which are slightly different from the above technologies.

As a resist giving a high resolution to a light source of short wavelength or to an electron beam, an EUV, an X ray, an ion beam or the like, there was proposed "a chemically amplified resist" by IBM Co. Currently, improvements for this chemically amplified resist and developments of a new chemically amplified resist are being made actively.

Use of a light source of shorter wavelength has forced the structural change of the resin used in a resist. Therefore, in a lithography using a KrF excimer laser beam, there is used a polyhydroxystyrene showing high transparency to 248 nm, or a resin obtained by protecting the hydroxyl group of the polyhydroxystyrene with an acid-dissociable, dissolution-inhibiting group; in a lithography using an ArF excimer laser beam, attention is being paid to an acrylic resin transparent to 193 nm or a cycloolefin resin because the polyhydroxystyrene has insufficient transparency to 193 nm and is substantially unusable.

As the acrylic resin, there are mentioned those disclosed in JP-A 39665/92, JP-A 207069/98, etc.; as the cycloolefin resin, there are mentioned those disclosed in JP-A 153864/98, etc.

These resins, however, are still insufficient in performance, and a higher resolution and a good resist shape are needed. As the reason for low resolution and inferior resist shape, there is pointed out, for example, the deactivation of acid caused by the basic substance in air or the basic substance infiltrating from substrate. As a method for solving such a problem, it is known, for example, to add a basic compound in a KrF exciter laser beam lithography (JP-A 179300/97).

Currently; however, a resist of higher performance is required in industry. In an ArF laser beam lithography, in particular, a particular light source (wavelength) and a particular resin are used and a particular resolution is required; therefore, no effective additive has been found.

DISCLOSURE OF THE INVENTION

In view of the above situation, the present invention aims at providing a chemically amplified resist composition which is high in sensitivity and resolution and capable of giving a good resist shape when used in a DUV excimer laser beam lithography or a lithography using an electron beam, an EUV, an X ray, an ion beam or the like.

In order to achieve the above aim, the present invention provides a chemically amplified resist composition comprising:
  a resin which becomes soluble in an aqueous alkali solution in the presence of an acid,
  a photo acid generator, and
  an amine derivative which shows, in water of 25° C., such a basicity as to form a conjugate acid and has a medium polarity.

This chemically amplified resist composition is high in sensitivity and resolution and good in resist shape and can form a very precise and fine resist pattern stably.

Therefore, the present chemically amplified resist composition can be suitably used in a DUV excimer laser beam lithography or a lithography using an electron beam, an EUV, an X ray, an ion beam or the like, particularly in a lithography using an ArF excimer laser beam.

BEST MODE FOR CARRYING OUT THE INVENTION

The present invention is described in detail below.

It is already known to add a basic compound to a chemically amplified resist. Such a basic compound is generally called a quencher because the compound is considered to quench an acid generated from a photo acid generator.

The action mechanism of the quencher is not clear. However, as to the mechanism, there is, for example, a theory that the quencher forms an acid-base equilibrium in a resist system and supplies a fresh acid to a portion of reduced acid concentration. However, the true action mechanism of the quencher is presumed to be very complicated because various factors such as compatibility with resin, diffusion and the like are also involved.

It is known that by adding this quencher to a resist, various favorable effects are obtained, for example, formation of a sparingly soluble surface layer is prevented, a higher resolution is obtained, and higher PED stability is obtained.

The present inventors found out that by adding, as a quencher, an amine derivative having at least one of the three characteristics explained below, a chemically amplified resist is obtained which is significantly improved in resolution and gives a very good resist shape.

The first characteristic of the amine derivative used in the present invention lies in its skeleton. That is, the amine derivative of the present invention is preferably an amide compound represented by the following general formula (1):

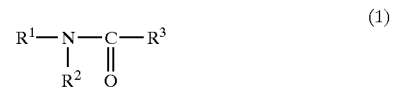

(1)

(wherein $R^1$, $R^2$ and $R^3$ are each independently hydrogen or an alkyl group having 1 to 30 carbon atoms).

At least two of $R^1$, $R^2$ and $R^3$ in the general formula (1) preferably bond to each other to form a cyclic skeleton because there are obtained advantages such as very high resolution, good resist shape and the like.

Also, at least one of $R^1$ and $R^2$ in the general formula (1) is preferably a cyclic alkyl group having 3 to 30 carbon atoms, for the same reasons.

As specific examples of the amide compound of the general formula (1), there can be mentioned N-cyclohexylformamide, N-cyclohexylacetamide, 1-cyclohexyl-2-pyrrolidinone, N-cyclohexyl-δ-valerolactam, N-cyclohexyl-ε-caprolactam, N-isobornylformamide, N-isobornylacetamide, N-isobornyl-2-pyrrolidinone, N-isobornyl-δ-valerolactam, N-isobornyl-ε-caprolactam, N-adamantylformamide, N-adamantylacetamide, N-adamantyl-2-pyrrolidinone, N-adamantyl-δ-valerolactam, N-adamantyl-ε-caprolactam, N-tricyclodecanylformamide, N-tricyclodecanylacetamide, N-tricyclodecanyl-2-pyrrolidinone, N-tricyclodecanyl-δ-valerolactam, N-tricyclodecanyl-ε-caprolactam, N-dicyclopentadienylformamide, N-dicyclopentadienylacetamide, N-dicyclopentadienyl-2-pyrrolidinone, N-dicyclopentadienyl-δ-valerolactam, and N-dicyclopentadienyl-ε-caprolactam.

The amide compound represented by the general formula (1) can be used in one kind or in admixture of two or more kinds.

The content of the amide compound represented by the general formula (1) varies depending upon the kind of the amide compound but is ordinarily 0.01 to 10 moles, preferably 0.05 to 1 mole per mole of the photo acid generator.

When the content of the amide compound represented by the formula (1) is higher in the ordinary content range, a better resist shape is obtained generally; when the content is lower, higher resist sensitivity and higher developability of exposed resist portion are obtained generally.

The second characteristic of the amine derivative used in the present invention lies in the intensity of the basicity. That is, the amine derivative is preferably a basic compound capable of forming a conjugate acid in water of 25° C.

Incidentally, the basicity of the basic compound can be quantified by the pKa of the conjugate acid generated by the basic compound. In the present invention, the pKa of the conjugate acid in water of 25° C. is preferably −3 to 3, more preferably −2 to 2.

By using, as a quencher, a basic compound capable of generating a conjugate acid having a pKa of −3 to 3, in a resist composition, formation of a sparingly soluble surface layer is prevented and an improved resolution is obtained, in particular.

Effects such as improved PED stability and the like are also obtained, and a resolution far higher than in using a conventional quencher is obtained.

When a basic compound forming a conjugated acid having a pKa of less than −3 is used, an inferior resist shape may result; when the pKa of conjugate acid is more than 3, resist sensitivity or developability of exposed resist portion may be low.

The basic compound capable of forming a conjugate acid having a pKa of −3 to 3 can be used in one kind or in combination of two or more kinds, so as to meet the necessity.

As the basic compound capable of forming a conjugate acid having a pKa of −3 to 3, used in the present invention, there can be mentioned, for example, acetamide, acetamidine, 3-aminopyridine- 1-oxide, 4-benzylpyridine-1-oxide, betaine, 2-bromoaniline, 2-bromopyridine, 2-chloro-6-nitroaniline, 4-chloro-2-nitroaniline, 2-chloropyridine, 3-chloropyridine, 3-chloro-o-toluidine, colchicine, 2-cyanopyridine, 3-cyanopyridine, 4-cyanopyridine-3,5-dibromoailine, 3,5-dichlroaniline, 2,5-dichloro-4-nitroaniline, 3,5-diiodoaniline, 4-dimethyl-aminobenzaldehyde, 2,4-dimethylpyridine- 1-oxide, 3,5-dinitroaniline, 5-ethyl-2-methylpyridine- 1-oxide, 2-ethylpyridine-1-oxide, 3-ethylpyridine-1-oxide, 2-fluoropyridine, 3-fluoropyridine, 2-iodoaniline, 2-iodopyridine, isocreatine, 2-methoxycarbonylaniline, 4-methoxycarbonylaniline, 2-methoxycarbonylpyridine, 2-(N-methylbenzamido)pyridine, 2-(N-methylmethanesulfonamido)pyridine, 2-methylpyridine-1-oxide, 3-methylpyridine-1-oxide, 4-methylpyridine-1-oxide, 3-methysulfonylaniline, 4-methylsulfonylaniline, 2-nitroaniline, 3-nitroaniline, 4-nitroaniline, phenazine, 5-phenylbarbituric acid, pyrazine, pyrazinecarboxyamide, pyrazole, pyridazine, 3-pyridinecarbonitrile, pyridine-1-oxide, pyrimidine, 3-pyrroline, quinoxaline, 2,3,5,6-tetramethyl-4-methylaminopyridine, triazoline, thiourea, 4-(trifluoromethyl)aniline, 2,4,6-trimethylpyridine-1-oxide, diphenylamine, 2-chloroaniline, 2-acetylpyridine, N-isopropylmethacrylamide, N-acetylethanolamine, β-propiolactam, 2-pyrrolidinone, δ-valerolactam, ε-caprolactam, benzamide, N-methylbenzamide, N-ethylbenzamide, N-isopropylbenzamide, N-isobutylbenzamide, N-sec-butylbenzamide, N-tert-butylbenzamide, N-benzylbenzamide, N,N-dimethylbenzamide, N,N-diethylbenzamide, N,N-diisopropylbenzamide, benzoylpiperidine, 2-azacyclooctanone, 2-azacyclononanone, N-methylacetamide, N-ethylacetamide, N-tert-butylacetamide, N-benzylacetamide, N-p-methoxybenzylacetamide, N-p-chlorobenzylacetamide, N,N-diethylacetamide, N,N-dimethylacetamide, urea, N,N-dimethylformamide, N-cyclohexylformamide, and N-isopropylacrylamide.

Of these, preferred are (meth)acrylamides, acetamides, isobutyramides, formamides and lactams.

The use amount of the basic compound capable of forming a conjugate acid having a pKa of −3 to 3 is appropriately determined depending upon the kind of the basic compound, but is ordinarily 0.01 to 10 moles, preferably 0.05 to 1 mole per mole of the photo acid generator.

When the use amount of the basic compound capable of forming a conjugate acid having a pKa of −3 to 3 is larger, a better resist shape is obtained generally; when the amount is smaller, higher resist sensitivity and higher developability of exposed resist portion are obtained generally.

The third characteristic of the amine derivative used in the present invention lies in the polarity. That is, the amine derivative is preferably a basic compound which has neither excessively high polarity nor excessively low polarity and has a medium polarity.

Incidentally, the polarity of the basic compound can be quantified by the water-octanol partition coefficient (Log P). In the present invention, the water-octanol partition coefficient (Log P) at 25° C. is preferably 0 to 1.5.

The water-octanol partition coefficient (Log P) referred to herein can be determined by a formula of a structure activity relationship described in J. Computational Chem., Vol. 9, No. 1, pp. 80 to 90(1988). Specifically, the water-octanol partition coefficient (Log P) of a basic compound can be determined from the above formula of the structure activity relationship by optimizing a molecular structure of the compound in its energy level using a nonempirical molecular orbital method (RHF/STO-3G) and a semiempirical molecular orbital method (AMI or PM3).

A smaller water-octanol partition coefficient (Log P) indicates more amount distribution in water and a larger water-octanol partition coefficient indicates more amount distribution in octanol.

By using, as a quencher, a basic compound having a water-octanol partition coefficient (Log P) of 0 to 1.5, in a resist composition, formation of a sparingly soluble surface layer is prevented and an improved resolution is obtained, in particular.

Effects such as improved PED stability and the like are also obtained, and a resolution far higher than in using a conventional quencher is obtained.

When a basic compound having a water-octanol partition coefficient (Log P) of less than 0 is used, a inferior resist shape may result; when the water-octanol partition coefficient (Log P) is more than 1.5, resist sensitivity or developability of exposed resist portion may be low.

The basic compound having a water-octanal partition coefficient (Log P) of 0 to 1.5 can be used in one kind or in combination of two or more kinds, so as to meet the necessity.

As the basic compound having a water-octanol partition coefficient (Log P) of 0 to 1.5, used in the present invention, there can be mentioned, for example, N-isopropylmethacrylamide, N-cyclohexylformamide, 1-cyclohexyl-2-pyrrolidinone, ε-caprolactam, N-adamantylacetamide, N-isopropylisobutyramide, 1-acetyl-3-methylpiperizine, N-isopropylacrylamide, N-vinylcaprolactam, N-vinylpyrrolidinone, dimethylaminoethyl methacrylate, N,N-diethylacrylamide, dimethylaminopropylmethacrylamide, and dimethylaminopropylacrylamide.

Of these, preferred are (meth)acrylamides, acetamides, isobutyramides, formamides and lactams.

The use amount of the basic compound having a water-octanol partition coefficient (Log P) of 0 to 1.5 is appropriately determined depending upon the kind of the basic compound, but is ordinarily 0.01 to 10 moles, preferably 0.05 to 1 mole per mole of the photo acid generator.

When the use amount of the basic compound having a water-octanol partition coefficient (Log P) of 0 to 1.5 is larger, a better resist shape is obtained generally; when the amount is smaller, higher resist sensitivity and higher developability of exposed resist portion are obtained generally.

As described above, the amine derivative used in the present invention as a quencher, preferably has at least one of the first characteristic regarding the skeleton, the second characteristic regarding the basicity and the third characteristic regarding the polarity.

Of such amine derivatives, those which have been confirmed to be particularly preferably used in the present invention, include N-isopropylmethacrylamide, N-cyclohexylformamide, 1-cyclohexyl-2-pyrrolidinone, N-methylacetamide, ε-caprolactam, 1-acetyl-3-methylpiperizine, etc.

According to the study hitherto made by the present inventors, amine derivatives having two of the above three characteristics are generally preferred, and amine derivatives having all of the three characteristics are generally more preferred.

Such an amine derivative is used in an amount of preferably 0.01 to 10 moles, more preferably 0.05 to 1 mole per mole of the photo acid generator.

At least one kind of amine derivative having at least one of the three characteristic can. be used so as to meet the necessity. When two or more kinds are used, the total amount of the kinds used is preferably within the above range.

Next, description is made on the resin which becomes soluble in an aqueous alkali solution in the presence of an acid, contained in the chemically amplified resist composition of the present invention (this resin is hereinafter described simply as resin, in some cases). There is no particular restriction as to this resin as long as it becomes soluble in an aqueous alkali solution in the presence of an acid, and the resin may be any resin for chemically amplified resist composition. The resin is appropriately selected depending upon the light source used in lithography.

For example, when the light source is a KrF excimer laser beam or an electron beam, a resin of high etching resistance obtained by (co)polymerizing p-hydroxystyrene or its derivative is used suitably. As a matter of course, such a resin contains, in the (co)polymer structure, functional group which is eliminated by an acid and becomes soluble in an alkaline developing solution.

Preferred specific examples of such a (co)polymer are those obtained by protecting the hydroxyl group of p-hydroxystyrene monomer units or the carboxyl group of other monomer units with acetoxy group, tert-butyl group, tetrahydropyranyl group, methyladamantyl group or the like.

When the light source is an ArF excimer laser beam, the above-mentioned resin is unusable because the wavelength of the light source is short and the resin's light transmission is low. Therefore, there is suitably used a resin having an alicyclic skeleton, which has a high light transmission and relatively high etching resistance.

As specific examples of such a resin, there can be mentioned an acrylic resin described in JP-A 090637/97 and JP-A 207069/98 and an olefinic resin described in JP-A 207070/98 and JP-A 218941/98.

However, when the amide compound and the basic compound both disclosed in the present invention are used as a quencher, there is preferred a resin containing monomer units having an alicyclic skeleton and monomer units having a lactone skeleton, or a cycloolefin resin, and there are particularly preferred a polymer containing (meth)acrylic acid ester monomer units having an alicyclic skeleton and (meth)acrylic acid ester monomer units having a lactone skeleton.

The monomer units having an alicyclic skeleton can impart transparency and high resistance to dry etching, to the resin and a resin composition thereof. In particular, those monomer units containing acid-eliminatable protective group (the alicyclic group per se may be such a protective group) can impart high sensitivity at 193 nm.

Preferred as the monomer units having an alicyclic skeleton is a (meth)acrylic acid ester containing an alicyclic skeleton in the ester moiety.

In particular, the (meth)acrylic acid ester monomer units having an alicyclic skeleton is preferably selected from the group consisting of cyclohexyl (meth)acrylate, isobornyl (meth)acrylate, adamantyl (meth)acrylate, tricyclodecanyl (meth)acrylate, dicyclopentadienyl (meth)acrylate, and their derivatives formed by introducing a substituent such as alkyl group, carboxyl group, hydroxyl group or the like, onto the alicyclic ring of each of the above monomer units.

Specifically, there can be mentioned 1-isobornyl methacrylate, 2-methacryloyloxy-2-methyladamantane, cyclohexyl mehtacrylate, adamantyl methacrylate, tricyclodecanyl methacrylate, dicyclopentadienyl methacrylate, etc.

These monomer units having an alicyclic skeleton can be used singly or, as necessary, in combination of two or more kinds.

The (meth)acrylic acid ester monomer units having a lactone skeleton can impart adhesivity to substrate, to the resin and a resin composition thereof. In particular, those monomer units containing acid-eliminatable protective group (the lactone group per se may be such a protective group) can impart high sensitivity at 193 nm.

Preferred as the monomer units having a lactone skeleton is a (meth)acrylic acid ester containing a lactone skeleton in the ester moiety.

In particular, the (meth)acrylic acid ester monomer units having a lactone skeleton is preferably selected from the group consisting of (meth)acrylates having a δ-valerolactone ring, (meth)acrylates having a γ-butyrolactone ring, and their derivatives formed by introducing a substituent such as alkyl group, carboxyl group, hydroxyl group or the like, onto the lactone ring of each of the above monomer units.

Specifically, there can be mentioned β-methacryloyloxy-β-methyl-δ-valerolactone, β-methacryloyloxy-γ-butyrolactone, β-methacryloyloxy-β-methyl-γ-butyrolactone, α-methacryloyloxy-γ-butyrolactone, 2-(1-methacryloyloxy)ethyl-4-butanolide, pantolactone methacrylate, etc.

These monomer units having a lactone skeleton can be used singly or, as necessary, in combination of two or more kinds.

The resin which becomes soluble in an aqueous alkali solution in the presence of an acid, used in the present invention, has no particular restriction as to the weight-average molecular weight. The weight-average molecular weight, however, is preferably 1,000 or more in view of the dry etching resistance and resist shape required and 100,000 or less in view of the solubility in resist solvent and resolution required.

The resin which becomes soluble in an aqueous alkali solution in the presence of an acid, has no particular restriction, either, as to the production process. However, there can be mentioned, as a preferred production process, for example, a so-called dropping polymerization process which comprises dissolving monomers and a polymerization initiator in an organic solvent and dropping the resulting solution in an organic solvent kept at a given temperature.

The organic solvent used in this dropping polymerization process is preferably a solvent capable of dissolving all of the monomers mixture, the polymerization initiator and the copolymer obtained. There can be mentioned, for example, 1,4-dioxane, isopropyl alcohol, acetone, tetrahydrofuran, methyl isobutyl ketone.

As the polymerization initiator used in the dropping polymerization process, there can be mentioned, for example, azo compounds such as azobisisobutyronitrile, 2,2'-azobis(2,4-dimethylvaleronitrile) and the like; and organic peroxides such as benzoyl peroxide and the like. A mercaptan such as n-butylmercaptan, n-octylmercaptan or the like may be used as a chain transfer agent, in combination with the polymerization initiator.

In the dropping polymerization, the polymerization temperature is preferably 50 to 150° C., and the dropping time is preferably 6 hours or more. After the completion of the dropping, the polymerization temperature is preferably-kept for about 2 hours to complete polymerization.

Next, the copolymer solution obtained is diluted to an appropriate solution viscosity using a good solvent such as tetrahydrofuran, 1,4-dioxane or the like; then, the diluted solution is dropped into a large amount of a poor solvent such as methanol, water or the like to give rise to precipitation. The resulting precipitate is collected by filtration and dried sufficiently, whereby a resin used in the present invention can be obtained. This reprecipitation step is unnecessary in some cases but is very effective to remove the unreacted monomers, polymerization initiator, etc. remaining in the polymerization solution. The unreacted monomers, when remaining as they are, may adversely affect the properties of the resist to be compounded later; therefore, it is preferred to remove them.

The thus obtained resin is dissolved in a solvent together with a photo acid generator, whereby a chemically amplified resist composition (a solution) can be obtained.

The photo acid generator used above has no particular restriction as to the kind and can be freely selected from those usable as such an agent for chemically amplified resist composition.

Specifically, there can be mentioned onium salt compounds, sulfonimide compounds, sulfone compounds, sulfonic acid ester compounds, quinone diazide compounds, diazomethane compounds, etc.

Of these, onium salt compounds are preferred, and there can be mentioned, for example, sulfonium salts, iodonium salts, phosphonium salts, diazonium salts and pyridinium salts.

As specific examples, there can be mentioned triphenylsulfonium triflate, triphenylsulfonium hexafuoroantimonate, triphenylsulfonium naphthalenesulfonate, (hydroxyphenyl)benzylmethylsulfonium toluenesulfonate, diphenyliodonium triflate, diphenyliodonium pyrenesulfonate, diphenyliodonium dodecylbenzenesulfonate, and diphenyliodonium hexafluoroantimonate.

The photo acid generator can be used in one kind or in admixture of two or more kinds.

The amount of the photo acid generator used is appropriately determined depending upon the kind of the photo acid generator used. However, the amount is ordinarily 0.1 to 20 parts by mass, particularly preferably 0.5 to 10 parts by mass per 100 parts by mass of the resin. When the amount of the photo acid generator used is less than 0.1 part by mass, it may be difficult to sufficiently give rise to the chemical reaction caused by the catalysis of the acid generated when the agent is irradiated with a light. When the amount is more than 20 parts by mass, unevenness may appear in coating of resist composition and scum, etc. may be formed during development.

The solvent used is selected appropriately depending upon the application of resist composition. Preferably, the solvent is selected in view of the solubility of produced copolymer and photo acid generator, and other factors such as uniformity and appearance of formed film, safety and the like.

As solvents satisfying these requirements, there can be mentioned, for example, straight chain ketones such as 2-pentanone, 2-hexanone and the like; cyclic ketones such as cyclopentanone, cyclohexanone and the like; propylene glycol monoalkyl ether acetates such as propylene glycol monomethyl ether acetate, propylene glycol monoethyl ether acetate and the like; ethylene glycol monoalkyl ether acetates such as ethylene glycol monomethyl ether acetate, ethylene glycol monoethyl ether acetate and the like; propylene glycol monoalkyl ethers such as propylene glycol monomethyl ether, propylene glycol monoethyl ether and the like; ethylene glycol monoalkyl ethers such as ethylene glycol monomethyl ether, ethylene glycol monoethyl ether and the like; diethylene glycol alkyl ethers such as diethylene glycol dimethyl ether, diethylene glycol diethyl ether and the like; esters such as ethyl acetate, ethyl lactate and the like; alcohols such as cyclohexanol, 1-octanol and the like; ethylene carbonate; and γ-butyrolactone. These solvents can be used singly or in admixture of two or more kinds.

The resist composition (solution) may further contain, as necessary, various additives such as surfactant, sensitizer, halation inhibitor, storage stabilizer, antifoaming agent and the like.

As examples of the surfactant, there can be mentioned nonionic surfactants such as polyoxyethylene lauryl ether, polyethylene glycol dilaurate and the like; and commercial products such as Polyflow No. 75 (a product of Kyoeisha chemical Co., Ltd.), Megaface F 173 (a product of Dainippon Ink and Chemicals, Incorporated), Surflon SC-105 (a product of Asahi Glass Co., Ltd.), L-70001 (a product of Nippon Unicar Co., Ltd.) and the like.

In forming a resist pattern using the thus-obtained resist composition (solution), the solution is coated on a substrate in a give thickness by a known means such as spin coating or the like, then dried appropriately, and irradiated using a given light source. Thereafter, baking is conducted as necessary, followed by development using an alkali developing solution to obtain an intended pattern.

The above-described chemically amplified resist composition has a very high resolution.

Specifically, the chemically amplified resist composition can have a resolution of 0.15 micron or less, preferably 0.14 micron or less, more preferably 0.13 micron or less, most preferably 0.12 micron or less; when the resist composition is coated on bare silicon to form a resist of 0.5 micron in thickness, a light of 193 nm emitted from an argon fluorine excimer laser is applied to the resist at an exposure of 5 mJ/cm$^2$ or less through a mask having a pattern of line/space=1/1 to project the pattern to the resist in ¼ reduction, and the resulting resist is heat-treated at 120° C. for 60 seconds and subjected to development with a 2.38 mass % aqueous tetramethylammonium hydroxide solution of 23° C. for 60 seconds.

Also, the chemically amplified resist composition can give a line width difference between resist top and resist bottom, of 10% or less, in a resist pattern of 0.12 micron formed; when the resist composition is coated on bare silicon to form a resist of 0.5 micron in thickness, a light of 193 nm. emitted from an argon fluorine excimer laser is applied to the resist at an exposure of 5 mJ/cm$^2$ or less through a mask having a pattern of line/space=1/1 to project the pattern to the resist in ¼ reduction, and the resulting resist is heat-treated at 120° C. for 60 seconds and subjected to development with a 2.38 mass % aqueous tetramethylammonium hydroxide solution of 23° C. for 60 seconds.

Hereinafter, the present invention is described more specifically by producing the chemically amplified resist composition of the present invention. In the following, "parts" refer to "parts by mass" unless otherwise specified, and commercial high-purity products were used for chemical reagents.

Properties of resins were measured as follows.

Weight-average Molecular Weight

Determined in terms of polymethyl methacrylate-reduced weight-average molecular weight by gel permeation chromatography (GPC).

Average Comonomer Composition (Mole %) of Copolymer

Determined by $^1$H-NMR measurement. Deuterated chloroform or deuterated acetone was used as a solvent.

Resists were evaluated as follows.

Sensitivity

A resist composition solution was spin-coated on a silicon wafer and prebaked at 120° C. for 60 seconds using a hot plate to form a resist film of 0.5 μm in thickness. Then, a mask having a pattern of line/space=1/1 was projected to the resist film in ¼ reduction, using a KrF excimer laser beam aligner or an ArF excimer laser beam aligner. The resulting resist film was baked at 120° C. for 60 seconds using a hot plate, after which the resist film was developed with a 2.38 mass % aqueous tetramethylammonium hydroxide solution of 23° C., washed with pure water, and dried to form a resist pattern. An exposure capable of forming a line and space pattern (L/S=1/1) at a line width of 1/1 was measured and taken as the sensitivity of the resist composition solution used.

Threshold Resolution

The minimum dimension (μm) of the resist pattern formed at the above exposure was taken as the threshold resolution of the resist composition solution used.

Resist Shape

Resist shape was evaluated according to any of the following three methods.

First method: Resist sectional shape was observed using an electron microscope. A case of inferior sectional shape was rated as "X"; a case which had a good sectional shape and wherein there was little formation of sparingly soluble surface layer, was rated as "○"; and a case which had a better sectional shape, wherein there was little film thinning, and whose sectional shape was close to a rectangle, was rated as "⊚". Further, the difference in line width (DD) between resist top and resist bottom in 0.12 micron pattern was calculated from the following formula;

$$DD(\%)=[(\text{line width at top}-\text{line width at bottom})/(\text{line width at bottom})]\times 100$$

Second method: Resist sectional shape was observed using an electron microscope. A case of rectangular sectional shape was rated as "good"; a case wherein there was formation of sparingly soluble surface layer, was rated as "T-top"; a case wherein the top (surface) became thinner, was rated as "tapered"; and a case wherein the film thickness became smaller, was rated as "film thinning".

Resin 1

In a nitrogen atmosphere, 20.0 parts of 1,4-dioxane was fed into a flask provided with a nitrogen inlet tube, a stirrer, a condenser and a thermometer. The temperature of the hot water bath was increased to 80° C. with the flask contents being stirred. Into the flask was dropwise added, at a given rate in 6 hours, a monomer solution of a mixture with 29.3 parts of 2-methacryloyloxy-2-methyladamantane (abbreviation: MAdMA), 15.0 parts of p-hydroxystyrene (abbreviation: HS), 62.5 parts of 1,4-dioxane and 1.9 parts of azobisisobutyronitrile. Then, the temperature of 80° C. was kept for 2 hours to give rise to a reaction. The reaction mixture was diluted to about two-fold with tetrahydrofuran. The diluted solution was dropped into about ten-fold water with stirring, to obtain a white precipitate (resin 1). The precipitate was collected by filtration and dried under vacuum at 60° C. for about 40 hours.

The thus-obtained resin 1 was measured for properties. It had a weight-average molecular weight of 12,000 and a comonomer ratio of MAdMA/HS=51/49 mole %.

Resin 2

Resin 2 was produced in the same manner as in the case of the resin 1 except that 29.3 parts of MAdMA was replaced by 22.0 parts of p-tert-butoxystyrene (abbreviation: PTBST, molecular weight: 176). The resin 2 had a weight-average molecular weight of 12,000 and a comonomer ratio of PTBST/HS=51/49 mole %.

Resin 3

In a nitrogen atmosphere, 20.0 parts of 1,4-dioxane was fed into a flask provided with a nitrogen inlet tube, a stirrer, a condenser and a thermometer. The temperature of the hot water bath was increased to 80° C. with the flask contents being stirred. Into the flask was dropwise added, at a given rate in 6 hours, a monomer solution of- a mixture with 29.3 parts of 2-methacryloyloxy-2-methyladamantane (abbreviation: MAdMA), 21.2 parts of β-methacryloyloxy-γ-butyrolactone (abbreviation: HGBMA), 62.5 parts of 1,4-dioxane and 1.9 parts of azobisisobutyronitrile. Then, the temperature of 80° C. was kept for 2 hours to give rise to a reaction. The reaction mixture was diluted to about two-fold with tetrahydrofuran. The diluted solution was dropped into about ten-fold methanol with stirring, to obtain a white precipitate (resin 3). The precipitate was collected by filtration and dried under vacuum at 60° C. for about 40 hours.

The thus-obtained resin 3 was measured for properties. It had a weight-average molecular weight of 11,000 and a comonomer ratio of MAdMA/HGBMA=50/50 mole %.

Chemically Amplified Resist Compositions 1 to 10

There were mixed, as shown in Table 1-1, 100 parts of a resin, 2 parts of triphenylsulfonium triflate (as an agent generating an acid when irradiated with a light), 0.1 mole (per mole of the photo acid generator) of an amide derivative and 500 parts of propylene glycol monomethyl ether acetate (as a solvent), to form a uniform solution. The solution was filtered through a membrane filter having a pore diameter of 0.1 μm, to produce chemically amplified resist compositions 1 to 10.

Resist patterns of the chemically amplified resist compositions 1, 2, 3, 7 and 9 were formed using a KrF excimer laser beam aligner and evaluated. The results are shown in Table 1-2.

Resist patterns of the chemically amplified resist compositions 4, 5, 6, 8 and 10 were formed using an ArF excimer laser beam aligner and evaluated. The results are shown in Table 1-3.

It was appreciated from these evaluation results that by allowing a resist composition to contain an amine derivative having a particular skeleton, the resulting resist composition could have a higher resolution without inviting a large reduction in sensitivity and showed a good resist shape.

TABLE 1-1

| Composition | Resin | Amine derivative |
|---|---|---|
| 1 | 1 | N-isopropylmethacrylamide |
| 2 | 1 | N-cyclohexylformamide |
| 3 | 1 | 1-Cyclohexyl-2-pyrrolidinone |
| 4 | 3 | N-isopropylmethacrylamide |
| 5 | 3 | N-cyclohexylformamide |
| 6 | 3 | 1-Cyclohexyl-2-pyrrolidinone |
| 7 | 1 | No addition |
| 8 | 3 | No addition |
| 9 | 1 | N-phenyldiethanolamine |
| 10 | 3 | 2,6-Diisopropylaniline |

TABLE 1-2

| Composition | Sensitivity (mJ/cm²) | Resolution (μm) | Resist shape |
|---|---|---|---|
| 1 | 11.6 | 0.26 | ○ |
| 2 | 10.2 | 0.25 | ⊙ |
| 3 | 13.5 | 0.25 | ⊙ |
| 7 | 10.1 | 0.35 | X |
| 9 | 35.2 | 0.35 | X |

TABLE 1-3

| Composition | Sensitivity (mJ/cm²) | Resolution (μm) | Resist shape | DD (%) |
|---|---|---|---|---|
| 4 | 4.0 | 0.12 | ○ | 7 |
| 5 | 3.6 | 0.12 | ⊙ | 4 |
| 6 | 4.5 | 0.12 | ⊙ | 4 |
| 8 | 3.6 | 0.16 | X | 16 |
| 10 | 25.6 | 0.17 | X | 25 |

Chemically Amplified Resist Compositions 11 to 22

Chemically amplified resist compositions 11 to 22 were produced in the same manner as in the case of the chemically amplified resist compositions 1 to 10 except that the resins and amine derivatives shown in Table 2-1 were used. Incidentally, the conjugate acid of N-isopropylmethacrylamide had a pKa of −1.5, the conjugate acid of N-methylacetamide had a pKa of −0.42, the conjugate acid of ε-caprolactam had a pKa of −0.46, the conjugate acid of dimethylaminoethyl methacrylate had a pKa of 10, and the conjugate acid of cyanoethyl methacrylate had a pKa of −6.

Resist patterns of the chemically amplified resist compositions 11, 12, 13, 17, 18 and 19 were formed using a KrF excimer laser beam aligner and evaluated. The results are shown in Table 2-2.

Resist patterns of the chemically amplified resist compositions 14, 15, 16, 20, 21 and 22 were formed using an ArF excimer laser beam aligner and evaluated. The results are shown in Table 2-3.

It was appreciated from these evaluation results that by allowing a resist composition to contain an amine derivative having a particular basicity, the resulting resist composition could have a higher resolution without inviting a large reduction in sensitivity and showed a good resist shape.

TABLE 2-1

| Composition | Resin | Amine derivative |
|---|---|---|
| 11 | 2 | N-isopropylmethacrylamide |
| 12 | 2 | N-methylacetamide |
| 13 | 2 | ε-caprolactam |
| 14 | 3 | N-isopropylmethacrylamide |
| 15 | 3 | N-methylacetamide |
| 16 | 3 | ε-caprolactam |
| 17 | 2 | No addition |
| 18 | 2 | Dimethylaminoethyl methacrylate |
| 19 | 2 | Cyanoethyl methacrylate |
| 20 | 3 | No addition |
| 21 | 3 | Dimethylaminoethyl methacrylate |
| 22 | 3 | Cyanoethyl methacrylate |

TABLE 2-2

| Composition | Sensitivity (mJ/cm$^2$) | Resolution ($\mu$m) | Resist shape |
|---|---|---|---|
| 11 | 11.2 | 0.25 | Good |
| 12 | 12.2 | 0.26 | Good |
| 13 | 13.5 | 0.26 | Good |
| 17 | 10.1 | 0.35 | T-top |
| 18 | 35.2 | 0.35 | Tapered |
| 19 | 11.0 | 0.35 | T-top |

TABLE 2-3

| Composition | Sensitivity (mJ/cm$^2$) | Resolution ($\mu$m) | Resist shape |
|---|---|---|---|
| 14 | 5.0 | 0.13 | Good |
| 15 | 5.8 | 0.14 | Good |
| 16 | 6.0 | 0.14 | Good |
| 20 | 3.6 | 0.16 | T-top |
| 21 | 21.2 | 0.19 | Tapered |
| 22 | 3.6 | 0.17 | T-top |

TABLE 3-2

| Composition | Sensitivity (mJ/cm$^2$) | Resolution ($\mu$m) | Resist shape |
|---|---|---|---|
| 23 | 11.2 | 0.26 | Good |
| 24 | 13.2 | 0.25 | Good |
| 25 | 13.0 | 0.25 | Good |
| 29 | 10.1 | 0.35 | T-top |
| 30 | 15.2 | 0.35 | Film thinning |
| 31 | 13.5 | 0.35 | Film thinning |

TABLE 3-3

| Composition | Sensitivity (mJ/cm$^2$) | Resolution ($\mu$m) | Resist shape |
|---|---|---|---|
| 26 | 5.0 | 0.14 | Good |
| 27 | 5.8 | 0.13 | Good |
| 28 | 5.5 | 0.13 | Good |
| 32 | 3.6 | 0.16 | T-top |
| 33 | 7.0 | 0.18 | Film thinning |
| 34 | 5.0 | 0.17 | Film thinning |

Chemically Amplified Resist Compositions 23 to 34

Chemically amplified resist compositions 23 to 34 were produced in the same manner as in the case of the chemically amplified resist compositions 1 to 10 except that the resins and amine derivatives shown in Table 3-1 were used.

Incidentally, the Log P of N-isopropylmethacrylamide was 0.97, the Log P of 1-cyclohexyl-2-pyrrolidinone was 1.21, the Log P of N-cyclohexylformamide was 0.83, the Log P of N-acetylethanolamine was −1.24, and the Log P of 2-pyrrolidinone was −0.58. The water-octanol partition coefficient (Log P) shown here are water-octanol partition coefficients of Ghose, Pritchett and Crippen, calculated from RHF/STO-3G.

Resist patterns of the chemically amplified resist compositions 23, 24, 25, 29, 30 and 31 were formed using a KrF excimer laser beam aligner and evaluated. The results are shown in Table 3-2.

Resist patterns of the chemically amplified resist compositions 26, 27, 28, 32, 33 and 34 were formed using an ArF excimer laser beam aligner and evaluated. The results are shown in Table 3-3.

It was appreciated from these evaluation results that by allowing a resist composition to contain an amine derivative having a particular polarity, the resulting resist composition could have a higher resolution without inviting a large reduction in sensitivity and showed a good resist shape.

TABLE 3-1

| Composition | Resin | Amine derivative |
|---|---|---|
| 23 | 2 | N-isopropylmethacrylamide |
| 24 | 2 | 1-Cyclohexyl-2-pyrrolidinone |
| 25 | 2 | N-cyclohexylformamide |
| 26 | 3 | N-isopropylmethacrylamide |
| 27 | 3 | 1-Cyclohexyl-2-pyrrolidinone |
| 28 | 3 | N-cyclohexylformamide |
| 29 | 2 | No addition |
| 30 | 2 | N-acetylethanolamine |
| 31 | 2 | 2-Pyrrolidinone |
| 32 | 3 | No addition |
| 33 | 3 | N-acetylethanolamine |
| 34 | 3 | 2-Pyrrolidinone |

What is claimed is:

1. A chemically amplified resist composition, comprising
a resin which becomes soluble in an aqueous alkali solution in the presence of an acid,
a photo acid generator, and
an amine derivative which shows, in water of 25° C., a basicity as to form a conjugate acid and has a medium polarity, wherein the amine derivative is an amide compound represented by formula (1):

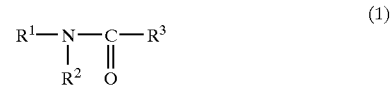

wherein $R^1$, $R^2$ and $R^3$ are each independently hydrogen or an alkl group having from 1 to 30 carbon atoms, and wherein at least one of $R^1$ and $R^2$ is a cyclic alkyl group having 3 to 30 carbon atoms.

2. The chemically amplified resist composition according to claim 1, wherein the amine derivative is a basic compound which forms a conjugate acid having a pKa of −3 to 3, in water of 25° C.

3. The chemically amplified resist composition according to claim 1, wherein the amine derivative is a basic compound which has such a polarity as to give a water-octanol partition coefficient (Log P) of 0 to 1.5 at 25° C.

4. The chemically amplified resist composition according to claim 1, wherein in formula (1), at least two of $R^1$, $R^2$ and $R^3$ bond to each other to form a cyclic skeleton.

5. A chemically amplified resist composition comprising a resin soluble in an aqueous alkali solution in the presence of an acid, which is a polymer comprising a (meth)acrylic acid ester monomer unit having an alicyclic skeleton, and a (meth)acrylic acid ester monomer unit having a lactone skeleton;
a photo acid generator; and
an amine derivative which shows, in water of 25° C., a basicity as to form a conjugate acid and has a medium polarity.

6. The chemically amplified resist composition according to claim 5, wherein the (meth)acrylic acid ester monomer unit having the alicyclic skeleton is at least one kind selected from the group consisting of cyclohexyl (meth)acrylate, isobornyl (meth)acrylate, adamantyl (meth)acrylate, tricyclodecanyl (meth)acrylate, dicyclopentadienyl (meth) acrylate, and their derivatives formed by introducing a substituent onto the alicyclic ring of the monomer unit.

7. The chemically amplified resist composition according to claim 5, wherein the (meth)acrylic acid ester monomer unit having the lactone skeleton is at least one kind selected from the group consisting of (meth)acrylates having a δ-valerolactone ring, (meth)acrylates having a γ-butyrolactone ring, and their derivatives formed by introducing a substituent onto the lactone ring of the monomer unit.

8. The chemically amplified resist composition according to claim 5, wherein the amine derivative is an amide compound represented by formiula (1):

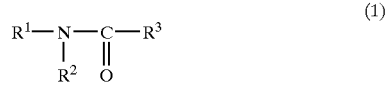

(1)

wherein $R^1$, $R^2$ and $R^3$ are each independently hydrogen or an alkyl group having 1 to 30 carbon atoms.

9. The chemically amplified resist composition according to claim 8, wherein in formula (1), at least two of $R^1$, $R^2$ and $R^3$ bond to each other to form a cyclic skeleton.

10. The chemically amplified resist composition according to claim 8, wherein in formula (1), at least one of $R^1$ and $R^2$ is a cyclic alkyl group having 3 to 30 carbon atoms.

11. The chemically amplified resist composition according to claim 5, wherein the amine derivative is a basic compound which forms a conjugate acid having a pKa of −3 to 3, in water of 25° C.

12. The chemically amplified resist composition according to claim 5, wherein the amine derivative is a basic compound which has such a polarity as to give a water-octanol partition coefficient (Log P) of 0 to 1.5 at 25° C.

13. A chemically amplified resist composition which gives a line width difference between resist top and resist bottom, of 4% or less, in a resist pattern of 0.12 micron formed, when the resist composition is coated on bare silicon to form a resist of 0.5 micron in thickness, a light of 193 nm emitted from an argon fluorine excimer laser is applied to the resist at an exposure of 5 mJ/cm² or less through a mask having a pattern of line/space=1/1 to project the pattern to the resist in ¼ reduction, and the resulting resist is heat-treated at 120° C. for 60 seconds and subjected to development with a 2.38 mass % aqueous tetramethylammonium hydroxide solution of 23° C. for 60 seconds.

* * * * *